| United States Patent [19] | [11] Patent Number: 5,061,776 |
|---|---|
| Weaver et al. | [45] Date of Patent: Oct. 29, 1991 |

[54] MODIFIED POLYURETHANE FLOW-UNDER THERMAL TRANSFER ADHESIVE

[75] Inventors: Mark A. Weaver, Redondo Beach; Lynn E. Long, Manhattan Beach; Steven E. Lau, Los Angeles, all of Calif.

[73] Assignee: Hughes Aircraft Company, Los Angeles, Calif.

[21] Appl. No.: 615,932

[22] Filed: Nov. 19, 1990

[51] Int. Cl.$^5$ .............................................. C08G 18/10
[52] U.S. Cl. ...................................... 528/60; 156/330; 156/331.4; 524/873; 525/528; 528/66; 528/73
[58] Field of Search .......................... 528/60, 66, 73; 525/528; 156/330, 331.4; 524/873

[56] References Cited

U.S. PATENT DOCUMENTS 4,870,142  9/1989  Czerinski et al. .................. 525/528

Primary Examiner—Maurice J. Welsh
Attorney, Agent, or Firm—Mary E. Lachman; W. J. Streeter; W. K. Denson-Low

[57] ABSTRACT

A thermal transfer adhesive composition which is applied after electronic components have been installed on a printed wiring board, comprising:
(a) 30 to 70 weight percent of an aliphatic diisocyanate or triisocyanate prepolymer;
(b) 5 to 15 weight percent of a polyether diol or triol;
(c) 20 to 40 weight percent of castor oil;
(d) 5 to 20 weight percent of an epoxy resin containing 2 or more hydroxyl group;
(e) 0.006 to 0.008 weight percent of a catalyst for the reaction of isocyanate groups with hydroxyl groups. The cured product is hydrolytically stable at 185° F. and 95 percent relative humidity and has a good storage life when frozen. Alternatively, the composition may also include a pigment.

12 Claims, No Drawings

MODIFIED POLYURETHANE FLOW-UNDER THERMAL TRANSFER ADHESIVE

BACKGROUND OF THE INVENTION

1. Field of the Invention

The present invention relates generally to a composition used to attach electronic components to a printed wiring board. More particularly, the present invention relates to urethane compositions which have been modified by the addition of an epoxy component and which are able to flow under pre-installed components on printed wiring boards.

2. Description of Related Art

In the fabrication of electronic devices, the individual electronic components are attached to the printed wiring board by the use of adhesive. Typical procedures consist of dispensing the adhesive onto the surface of the printed wiring board, installing the component in the desired location, curing the adhesive, soldering the leads from the component to the board, and removing the solder flux. The previously used adhesives required curing prior to the soldering operation because the uncured adhesive could not withstand the flux removal process. In this prior procedure, the position of the component relative to the printed wiring board sometimes changed during the heating step required for the curing of the adhesive. Consequently, lead bends required adjustment after the adhesive was cured in order to compensate for this shift. However, some degree of stress is induced in the leads, and complete contact of the adhesive with the underside of the component may be compromised.

Many different adhesives have been developed for attaching electronic components to printed wiring boards. Polyurethane resins have been used because of their high insulation resistance, good flexibility and low glass transition temperature. However, polyurethanes typically have a relatively short work life and storage life as a frozen premex, which makes them unacceptable for use in a mass production environment. In addition, polyurethanes do not exhibit good high temperature stability.

Another material which is widely used in the electronics industry as an adhesive consists of epoxy resin. Epoxy compounds typically have good insulating properties and excellent adhesion, and are easy to process. However, some epoxies may exhibit poor hydrolytic stability and mechanical properties, such as excessively high modulus and poor removability.

Thus, a need exists in the electronics industry for an adhesive composition which can minimize lead stress and provide uniform contact with the component, while at the same time possessing good processing characteristics and good physical properties when cured.

SUMMARY OF THE INVENTION

The general purpose of the present invention is to provide an adhesive composition which can be applied after the electronic components have been installed on a printed wiring board, and which has good thermal and hydrolytic stability, good adhesive properties, and good processing characteristics. This composition possesses most, if not all, of the advantages of the above prior art compositions while overcoming their above-mentioned significant disadvantages.

The above-described general purpose of the present invention is accomplished by providing a flow-under thermal transfer adhesive composition comprising:

(a) 30 to 70 weight percent of an aliphatic diisocyanate or triisocyanate prepolymer;
(b) 5 to 15 weight percent of a polyether diol or triol;
(c) 20 to 40 weight percent of castor oil;
(d) 5 to 20 weight percent of an epoxy resin containing 2 or more hydroxyl groups;
(e) 0.006 to 0.008 weight percent of a catalyst for the reaction of isocyanate groups with hydroxyl groups.

The cured product is hydrolytically stable at 185° F. and 95 percent relative humidity and has a good storage life when frozen. Alternatively, the composition may also include a pigment.

DESCRIPTION OF THE PREFERRED EMBODIMENTS

The composition of the present invention has been developed to provide an adhesive which can be applied after the electronic components have been installed on the printed wiring board and the soldering operation has been completed. This composition is able to flow under the pre-installed components and fill any gaps between the components and the board. This property is referred to herein as a "flow-under" adhesive. Since application and curing of the adhesive occurs after the soldering of leads and flux removal, lead bends do not have to be adjusted to compensate for displacement of the component relative to the board or to conform to changes in component height induced during adhesive cure. The flow and final set of the composition of the present invention conform to whatever gap has been previously established between the component and the board. Consequently, the time required for manufacture of these devices is significantly reduced, which leads to reduced costs. In addition, the devices manufactured with the adhesive composition of the present invention have improved reliability. Contamination of the present adhesive by solder flux is substantially reduced since the soldering operation is completed prior to the application of the adhesive. Further, the present composition exhibits the rheological properties, adhesion properties, hydrolytic stability, insulation properties, storage stability, solvent resistance, and freedom from bubbling during cure, which are required for this purpose. The present composition is a thermal transfer adhesive, that is, an adhesive which acts as a thermal transfer medium between the two members which it bonds.

The composition of the present invention comprises a polyurethane resin which has been modified by the addition of a selected epoxy resin. The epoxy component provides increased thermal stability, as well as providing good electrical properties in the cured material. The selection of the components described below and the relative proportions of each has been made in order to provide a composition which: (a) has the ability to flow under pre-installed components on a printed wiring board by capillary action and fill any gaps between the component and the board; (b) has an insulation resistance which provides the insulative properties required in the device; (c) has good adhesion; (d) has thermal and hydrolytic stability; (e) has a relatively long storage life; and (f) can accommodate a subsequent conformal coating with a parylene material without causing the parylene coating to blister.

The polyurethane component of the present composition comprises an aliphatic diisocyanate or triisocyanate prepolymer. As is known in the art, it is advantageous to use a partially reacted isocyanate, or prepolymer, to reduce the reactivity of the isocyanate and improve the safety of the process. The polyisocyanate that is, diisocyanate or triisocyanate, is present in the amount of about 30 to 70 percent by weight of the composition. A stoichiometric excess of the polyisocyanate is used in the present composition, based on the combined hydroxyl group content of the polyhydroxyl epoxy resin, polyether polyol, and castor oil, as discussed below. A preferred material is a 1,6-hexamethylene diisocyanate based adduct, or prepolymer, such as Desmodur N-3200, which may be obtained from Mobay Corporation of Pittsburgh, Pa. The NCO (isocyanate) content of Desmodur N-3200 is approximately 23 percent, and it is used in the amount of 40.9 to 50.0 weight percent. If a different polyisocyanate prepolymer is used, the amount would vary based on the NCO content of the prepolymer used.

The epoxy component of the present composition comprises a rigid epoxy resin which contains 2 or more hydroxyl groups. (The term "resin" is used herein to mean an uncured material.) The epoxy resin is present in the amount of about 5 to 20 percent by weight of the composition. A preferred material is a polyhydroxyl Bisphenol A diglycidyl ether, such as EPON 1001F, which may be obtained from Shell Chemical Company. The hydroxyl number of EPON 1001F is approximately 342, and it is used in the amount of 10.4 to 12.7 weight percent. If different polyhydroxyl epoxy resins are used, the amount would vary depending on their hydroxyl number.

Additional hydroxyl groups are provided in the composition of the present invention by a polyether diol or triol. The polyether diol or triol or polyether polyol) is present in the amount of about 5 to 15 percent by weight of the composition. A preferred material is polyoxypropylene polyether polyol, such as Voranol 2070, which may be obtained from Dow Chemical Company of Midland, Mich., and which is used in the amount of 10.4 to 12.7 weight percent. If other polyether polyols are used, the amount thereof would vary depending on their hydroxyl content.

The present composition also contains castor oil, a medium-weight triol, which is the glyceride of ricinoleic (octadecanoic) acid. The castor oil provides additional hydroxyl groups for reaction, and also serves as a reaction medium. In addition, the castor oil serves as a plasticizer for the cured product. The castor oil is present in the amount of about 20 to 40 weight percent, preferably about 27.8 to 34.0 percent by weight of the composition. The hydroxyl number of castor oil is approximately 164. If a different triol is used, the amount would vary based on the hydroxyl number.

A catalyst is provided in the present composition to accelerate the reaction of the isocyanate groups with the hydroxyl groups on the epoxy resin, the polyol, and the castor oil. Such catalysts are well known in the art. A preferred catalyst comprises tin and a most preferred catalyst is dibutyl tin dilaurate. The catalyst is present in the amount of about 0.006 to 0.008 percent by weight of the composition, and most preferably about 0.007 percent by weight. It has been found that that amount of catalyst must be closely controlled in order to sufficiently control rheological properties as a function of time and temperature.

Optionally, the present composition may also include a pigment to aid in detection of the adhesive during inspection, which may be present in the amount of 0.1 to 5 weight percent. The pigment must be compatible with the processing conditions used to cure the composition. One such pigment comprises SICO Orange L3052, an organic material with a 2,4-dinitroaniline coupled to a 2-naphthol structure, which may be obtained from BASF Corporation of Holland, Mich. Another material which may be used comprises a cadmium-based pigment, such as V-33860 obtained from Ferro Corporation of Los Angeles, Calif. The amount of pigment used depends on the amount of color desired, and may be present, for example, in the amount of about 0.5 to 0.7 percent by weight of the composition for SICO Orange L3052. If the pigment is provided in dry form, it is milled with an appropriate carrier, such as a Bisphenol A epoxy resin, to form a slurry which can conveniently be added to the composition.

Compositions in accordance with the present invention were prepared as described in Example 1 herein. The uncured compositions were tested as described in Examples 2 and 3 herein; and the cured compositions were tested as described in Example 4 herein. Finally, the compositions of the present invention were used to bond electronic components to test boards and were tested as described in Example 5 herein. From these test results, it may be seen that both the uncured and cured compositions of the present invention possess processing properties and physical and chemical characteristics which make these compositions well suited for use as an adhesive for the attachment of electronic components to a printed wiring board.

When used in the fabrication of electronic devices, the composition of the present invention is prepared as generally described in Example 1. The syringe containing the frozen adhesive composition of the present invention is removed from storage at −40° C. and allowed to thaw at room temperature for 20 to 25 minutes. Then, the syringe is used to apply the adhesive composition to the perimeter of each component where it contacts the printed wiring board on which it is installed. A vacuum of 0.3 torr maximum is applied at room temperature for about 30 minutes. By wicking action, the composition flows under the pre-installed components on the board. The adhesive is then cured at 160° F. (71° C.) for hour at ambient pressure.

Examples of practice of the present invention are as follows.

EXAMPLE 1

A preferred composition in accordance with the present invention was formulated as follows:

| Material | Parts by Weight |
| --- | --- |
| EPON 1001F | 33.4 |
| Voranol 2070 | 33.4 |
| Castor oil | 89.3 |
| Dibutyl tin dilaurate | 0.02 |
| SICO Orange L 3052 | 1.7 |
| Desmodur N-3200 | 131.4 |

It should be noted that the mixing and packaging processes described below should be followed due to the moisture-sensitive nature of polyurethane systems. A Ross Double Planetary Mixer, Model No. 130, obtained from Charles Ross & Son Company of Hauppage, N.Y., was used to mix the ingredients in this composition. First, the heating jacket of the Ross Mixer was brought to 95°±5° C. Next, 250±5 g minimum of castor oil was poured into the mixing vessel. The mixer was sealed, and the mixer speed was set at 0 5 Torr (0.5 millimeter of mercury), 95°±5° C. to dry the castor oil. Meanwhile, 10±1 g of molecular sieve pellets were dried at 110°±5° C. in a one-quart screw-top metal can for one hour in an air-circulating oven. Then, the hot castor oil was decanted from the mixer into the metal can containing the molecular sieve pellets. The can was purged with dry nitrogen gas and capped tightly.

The mixing vessel and paddles were cleaned and 33.4 parts by weight (pbw) each of Epon 1001F, Voranol 2070, and dried castor oil were placed in the vessel. The mixture was stirred and degassed at 0.5 Torr or less, 95°±5° C. until the mixture became clear, which took about 2-4 hours. Mixing was continued under vacuum while the mixing vessel was cooled to 25°±2° C., by draining the water in the heating jacket and replacing it with cool water.

The catalyst solution was prepared by adding 9 pbw dried castor oil to 1 pbw dibutyltin dilaurate, and then adding 9 pbw castor oil to 1 pbw of this mixture, yielding a 1 percent solution of the catalyst in the castor oil. Then 2.0 pbw of the catalyst solution was added to the cooled mixture in the mixing vessel. Next 1.7 pbw of the orange pigment was added to the mixing vessel. If dry pigment was used, 1 pbw of pigment was milled into 2 pbw of Epon 828, a diglycidyl ether of Bisphenol A, obtained from Shell Chemical Company, to obtain a slurry. The mixing vessel was sealed, and the contents were mixed and degassed for 45±5 minutes at <0.5 Torr and 25°±2° C. A small portion of the mixture was removed and tested for adequate dispersion of the pigment. If necessary, the mixture was subjected to additional mixing to achieve good pigment dispersion.

Finally, 53.9 pbw of dried castor oil and 131.4 pbw of Desmodur N-3200 were added to the mixture in the mixing vessel. The mixer was sealed and the contents of the mixer were mixed and degassed for 15±3 minutes at <0.5 Torr and 25°±2° C.

The finished adhesive was decanted into a syringe loading cartridge and the syringes were backloaded with the adhesive from the loading cartridge. The cartridge size was selected so that not more than 20 minutes would be required to fill the syringes. The loaded syringes were sealed into aluminized plastic bags, which were then frozen by burying in dry ice pellets, chips, or snow. The frozen syringe bags were stored at or below −40° C. (−40° F.).

Prior to being used, the frozen adhesive was thawed at room temperature for 20 to 25 minutes.

EXAMPLE 2

This example presents the results of the testing performed on the compostion of the present invention prepared as described in Example 1.

The liquid (uncured) composition of the present invention was tested for appearance, color, freedom from bubbling, viscosity and storage life. Viscosity was measured in accordance with the American Society for Testing and Materials (ASTM) D1824, Standard Test Method for Apparent Viscosity of Plastisols and Organosols at High Shear Rates by Brookfield Viscometer. Hardness (Shore A) was measured in accordance with ASTM D2240, Standard Test Method for Rubber Property—Durometer Hardness. The following results were obtained.

| Property Tested | | Results |
|---|---|---|
| 1. Appearance | | No visual defects |
| 2. Color | | Opaque orange |
| 3. Bubbling | | No bubble formation or foaming after 5 minutes degassing at 0.3 torr or lower. |
| 4. Viscosity | | |
| (a) | Initial viscosity (after thaw) at 70–72° F. (21–22° C.) | 5125 centipoise (cps) |
| (b) | Viscosity after 1 hour (after thaw) at 70–72° F. | 5425 cps |
| (c) | Viscosity after 2 hours (after thaw) at 70–72° F. | 6325 cps |
| (d) | Viscosity at 160° F. (71° C.) | 17 minutes to reach 10,000 cps |
| 5. Storage life (after 8 months at −40° C.) | | |
| (a) | Hardness (Shore A) per ASTM D2240 | 65 after 1 hour, 160° F. (71° C.) cure 78 after 12 hour, 160° F. (71° C.) cure |
| (b) | Freedom from bubbling | No bubble formation or foaming during 5 minute degassing at 0.3 Torr or lower. |
| (c) | Appearance | No visual defects |
| (d) | Viscosity | |
| (1) | Initial viscosity (after thaw) | 6250 cps |
| (2) | Viscosity after 2 hours (after thaw) | 7125 cps |
| (3) | Viscosity at 160° F. (71° C.) | 16.5 minutes to reach 10,000 cps |

EXAMPLE 3

This example presents the comparative results of testing performed on (a) a composition prepared as in Example 1 with the omission of the pigment (Sample A); (b) a composition according to Example 1 with a cadmium-based pigment (V-33860 obtained from Ferro Corporation) in place of the SICO Orange L3052 (Sample B); and (c) the composition prepared as in Example 1 (Sample C).

The liquid (uncured) compositions were tested for appearance, color, freedom from bubbling, viscosity and moisture content and the results shown in Table I were obtained. Moisture content was measured in accordance with ASTM D1744, Test Method for Water in Liquid Petroleum Products by Karl Fischer Reagent. Viscosity was measured in accordance with ASTM D1824.

TABLE I

COMPARATIVE DATA REGARDING PIGMENT CONTENT

| | Results | | |
|---|---|---|---|
| Property Tested | Sample A | Sample B | Sample C |
| Appearance (Visual defects) | None | None | None |
| Color | Clear transluscent | Opaque orange | Opaque orange |
| Bubble formation or | None | None | None |

TABLE I-continued

COMPARATIVE DATA REGARDING PIGMENT CONTENT

| Property Tested | Results Sample A | Sample B | Sample C |
|---|---|---|---|
| foaming after 5 minutes degassing at 0.3 Torr or less | | | |
| Time to complete degassing (minutes) | 3.5 | 1.5 | 3.5 |
| Initial viscosity (after thaw) at 70–72° F.; | 7500 cps | 6000 cps | 6000 cps |
| Viscosity after 1 hour (after thaw) at 70–72° F.; | 7375 cps | 6500 cps | 6375 cps |
| Viscosity after 2 hours (after thaw) at 70–72° F. | 8250 cps | 8000 cps | 8000 cps |
| Viscosity at 160° F. (71° C.) - Time to reach 10,000 cps | 14.2 minutes | 14.4 minutes | 15.1 minutes |
| Moisture Content* (%) | 0.02 | 0.01 | 0.03 |

Notes:
Sample A contains no pigment.
Sample B contains cadmium pigment.
Sample C contains organic pigment.
*Average of three samples.

EXAMPLE 4

This example presents the results of testing performed on the cured material obtained from the compositions of the present invention.

Samples of the composition prepared as in Example 1 were applied to printed circuit boards and visually examined. There was no evidence of pin holes, blistering, wrinkling, peeling, reversion or corrosion along printed circuit conductors (traces). The cured samples were then tested for hardness and solvent resistance, and the following results were obtained.

| Property tested | Results |
|---|---|
| 1. Hardness Shore "A" per ASTM D2240 | |
| (a) After 1 hr., 160° F. (71° C.) cure | 72 (average) |
| (b) After 12 hr., 160° F. (71° C.) cure | 81 (average) |
| 2. Solvent resistance | Material cured at 160° F. for one hour did not chip or flake from substrate after exposure to trichlorotrifluoro-ethane and 1,1,1-trichloro-ethane vapor degreasing for 2–3 minutes each. |

Additional tests of post-cure hardness (Shore A) versus time were performed at 160° F. (71° C.) and at 75° F. (24° C.) in accordance with the American Society for Testing and Materials (ASTM) D2240. The results are shown in Table II. Prior to initial measurements, all specimens were cured for 24 hours at ambient conditions, followed by 1 hour at 160° F. (71° C.).

Two series of 10-day moisture resistance tests were performed in which insulation resistance values (in ohms) were measured before, during, and after thermal cycling at high humidity.

TABLE II

POST-CURE HARDNESS VERSUS TIME

TABLE IIA AT 160° F. (71° C.)

| TIME HOURS at 160° F. | Specimen No. 1 | 2 | 3 | 4 | Avg. |
|---|---|---|---|---|---|
| Initial | | | | | |
| 0 | 70 | 71 | 71 | 72 | 71 |
| 1 | 70 | 73 | 72 | 73 | 72 |
| 2 | 73 | 74 | 73 | 74 | 74 |
| 4 | 76 | 77 | 77 | 76 | 76 |
| 8 | 79 | 80 | 79 | 79 | 79 |
| 16 | 84 | 85 | 84 | 85 | 84 |
| 24 | 84 | 84 | 85 | 85 | 85 |
| 48 | 91 | 90 | 89 | 89 | 90 |

TABLE IIB AT 75° F. (24° C.)

| TIME DAYS at 75° F. | Specimen No. A | B | C | D | Avg. |
|---|---|---|---|---|---|
| Initial | | | | | |
| 0 | 73 | 73 | 73 | 74 | 73 |
| 1 | 74 | 73 | 74 | 74 | 74 |
| 2 | 77 | 77 | 77 | 78 | 77 |
| 3 | 80 | 80 | 80 | 81 | 80 |
| 4 | 81 | 82 | 82 | 83 | 82 |
| 5 | 81 | 82 | 82 | 84 | 82 |
| 6 | 84 | 84 | 83 | 83 | 84 |
| 7 | 85 | 84 | 85 | 86 | 85 |

The measurements were made in accordance with MIL-I-46058, Insulating Compound, Electrical (for Coating Printed Circuit Assemblies), and MIL-STD-202, Test Methods for Electronic and Electrical Component Parts, Method 302, Condition B. The exposure conditions were as specified in MIL-STD-202, Method 106. The test results are shown in Table III. Sample Type 1 was formed from the composition as described in Example 1. Sample Type 2 was formed from the composition of Example 1 in which the cadmium-based pigment V-33860 from Ferro replaced the SICO Orange L3052. Sample Type 3 was formed from the composition of Example 1 with the omission of the pigment. The samples were cured at 71° C. (160° F.) for 4 hours or 12 hours as noted in Table III.

The thermal humidity aging of the cured composition of Example 1 was tested for 120 days at 85° C. and 95 percent relative humidity in accordance with MIL-I-46058. The insulation resistance was measured in accordance with MIL-STD-202, Method 302, Condition B. One set of tests was run without an overcoat of parylene (Sample Type 1); and a second set of tests was run with an overcoat of 0.7 mils (0.018 cm) of parylene (Sample Type 2). Parylene is a polyparaxylylene conformal coating, obtained from Union Carbide Corporation of Indianapolis, Indiana. A third set of samples was run with a parylene coating only (Sample Type 3). The test results are shown in Table IV. All control specimens were maintained at 25° C., 50% relative humidity for 120 days. No softening, chalking, cracking, blistering, reversion, or loss of adhesion was observed on exposed specimens after 120 days at 185° F. (85° C.), 95% relative humidity.

These results show that the cured adhesive compositions of the present invention continue to be electrically insulative and do not revert during and after temperature and humidity cycling.

TABLE III

10-DAY MOISTURE RESISTANCE TESTS

| SAMPLE TYPE | VALUE TYPE | INITIAL* | AFTER 5TH STEP | | | | FINAL** |
|---|---|---|---|---|---|---|---|
| | | | CYCLE 1 | CYCLE 4 | CYCLE 7 | CYCLE 10 | |
| 1 (4 hr. cure) | Average | $4.3 \times 10^{13}$ | $4.4 \times 10^9$ | $3.4 \times 10^9$ | $2.6 \times 10^9$ | $2.2 \times 10^9$ | $3.3 \times 10^{12}$ |
| | Minimum | $3.5 \times 10^{13}$ | $3.6 \times 10^9$ | $2.5 \times 10^9$ | $1.8 \times 10^9$ | $1.6 \times 10^9$ | $2.5 \times 10^{12}$ |
| 1 (12 hr. cure) | Average | $5.9 \times 10^{13}$ | $1.1 \times 10^{10}$ | $1.1 \times 10^{10}$ | $1.1 \times 10^{10}$ | $9.0 \times 10^9$ | $7.7 \times 10^{12}$ |
| | Minimum | $5.1 \times 10^{13}$ | $9.5 \times 10^9$ | $1.0 \times 10^{10}$ | $1.0 \times 10^{10}$ | $8.8 \times 10^9$ | $6.3 \times 10^{12}$ |
| 2 (12 hr. cure) | Average | $6.9 \times 10^{13}$ | $1.1 \times 10^{10}$ | $1.0 \times 10^{10}$ | $9.8 \times 10^9$ | $8.3 \times 10^9$ | $7.6 \times 10^{12}$ |
| | Minimum | $6.2 \times 10^{13}$ | $9.8 \times 10^9$ | $1.0 \times 10^{10}$ | $9.5 \times 10^9$ | $7.9 \times 10^9$ | $7.0 \times 10^{12}$ |
| 3 (12 hr. cure) | Average | $7.2 \times 10^{13}$ | $1.0 \times 10^{10}$ | $9.4 \times 10^9$ | $9.8 \times 10^9$ | $8.3 \times 10^9$ | $7.1 \times 10^{12}$ |
| | Minimum | $6.4 \times 10^{13}$ | $8.8 \times 10^9$ | $8.3 \times 10^9$ | $9.5 \times 10^9$ | $7.7 \times 10^9$ | $6.2 \times 10^{12}$ |

Notes:
Sample Type 1 contains organic pigment.
Sample Type 2 contains cadmium pigment.
Sample Type 3 contains no pigment.
*Average values for initial measurements include controls.
**Final measurement was performed at 25° C. and 50% relative humidity after allowing 24 hour recovery period at 25° C. and 50% relative humidity.

TABLE IV

THERMAL HUMIDITY AGING AT 85° C. AND 95% RELATIVE HUMIDITY

| SAMPLE TYPE | VALUE NO. | INITIAL IR (ohms) | 28-DAY IR (ohms) | 56-DAY IR (ohms) | 84-DAY IR (ohms) | FINAL* 120-DAY IR (ohms) |
|---|---|---|---|---|---|---|
| 1 | 1 | $5.6 \times 10^{13}$ | $5.0 \times 10^{10}$ | $6.6 \times 10^{10}$ | $2.6 \times 10^{11}$ | $1.5 \times 10^9$ |
| | 2 | $9.0 \times 10^{13}$ | $6.5 \times 10^{10}$ | $4.0 \times 10^{10}$ | $2.4 \times 10^{10}$ | $2.4 \times 10^9$ |
| | 3 | $1.2 \times 10^{14}$ | $1.3 \times 10^{11}$ | $8.4 \times 10^{10}$ | $7.0 \times 10^{10}$ | $4.3 \times 10^9$ |
| | 4 | $1.2 \times 10^{14}$ | $2.6 \times 10^{11}$ | $7.8 \times 10^{10}$ | $5.2 \times 10^{10}$ | $5.6 \times 10^9$ |
| 1 (Controls) | 1 | $1.0 \times 10^{14}$ | $1.1 \times 10^{14}$ | $1.3 \times 10^{14}$ | $1.4 \times 10^{14}$ | $1.0 \times 10^{14}$ |
| | 2 | $1.4 \times 10^{14}$ | $2.0 \times 10^{13}$ | $1.6 \times 10^{14}$ | $1.8 \times 10^{14}$ | $1.1 \times 10^{14}$ |
| | 3 | $1.2 \times 10^{14}$ | $1.7 \times 10^{14}$ | $2.0 \times 10^{14}$ | $2.7 \times 10^{14}$ | $1.2 \times 10^{14}$ |
| | 4 | $1.2 \times 10^{14}$ | $8.5 \times 10^{13}$ | $1.2 \times 10^{14}$ | $1.6 \times 10^{14}$ | $1.3 \times 10^{14}$ |
| 2 | A | $2.0 \times 10^{14}$ | $1.1 \times 10^{11}$ | $1.1 \times 10^{11}$ | $6.1 \times 10^{10}$ | $5.8 \times 10^9$ |
| | B | $1.9 \times 10^{14}$ | $2.2 \times 10^{10}$ | $7.0 \times 10^{10}$ | $3.7 \times 10^{10}$ | $1.2 \times 10^9$ |
| | C | $3.5 \times 10^{14}$ | $1.1 \times 10^{11}$ | $1.0 \times 10^{11}$ | $4.8 \times 10^{10}$ | $4.7 \times 10^9$ |
| | D (control) | $1.3 \times 10^{14}$ | $1.6 \times 10^{14}$ | $1.8 \times 10^{14}$ | $8.0 \times 10^{13}$ | $9.0 \times 10^{13}$ |
| 3 | A | $1.2 \times 10^{15}$ | $1.3 \times 10^{11}$ | $9.0 \times 10^{10}$ | $4.8 \times 10^{10}$ | $1.1 \times 10^8$ |
| | B | $1.9 \times 10^{15}$ | $1.9 \times 10^{11}$ | $7.0 \times 10^{10}$ | $1.3 \times 10^{11}$ | $4.5 \times 10^8$ |
| | C | $1.1 \times 10^{15}$ | $2.3 \times 10^{11}$ | $2.3 \times 10^{11}$ | $8.0 \times 10^{10}$ | $1.3 \times 10^8$ |
| | D (control) | $1.1 \times 10^{15}$ | $1.1 \times 10^{15}$ | $1.6 \times 10^{14}$ | $3.1 \times 10^{14}$ | $2.0 \times 10^{14}$ |

Notes:
IR = insulation resistance.
Sample Type 1 was the cured product of the composition of Example 1.
Sample Type 2 was the same as Sample Type 1 with a parylene overcoat added.
Sample Type 3 was a coating of parylene only.
Controls were maintained at 25° C., 50% relative humidity.
*Final 120-day measurement was performed at 25° C., 95% humidity.

EXAMPLE 5

This example presents the results of tests performed on compositions of the present invention when used to bond electronic components to test boards.

A sample of the composition prepared as described in Example 1 was applied, as previously described, around the perimeter of an electronic component which had been attached to a test board by leads. After the composition had been degassed and cured as previously described, the cured material was visually examined with the naked eye and under 4×magnification and was found to be easily visible in both cases. The cured material was visually observed to have continuous bondline fill and wetting and had no bubbles. The test board was then coated with parylene, and again visually examined. The cured material was still easily visible to the naked eye and under 4×magnification, had continuous bondline fill and wetting, and had no bubbles.

These tests were repeated using a composition prepared as described in Example 1, except that the SICO Orange L3052 pigment was omitted. The test results for the unpigmented composition were the same as those for the pigmented composition described above.

Having thus described exemplary embodiments of the present invention, it should be noted by those skilled in the art that the disclosures within are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A composition adapted for use as a flow-under thermal transfer adhesive comprising:
   (a) 30 to 70 weight percent of an aliphatic diisocyanate or triisocyanate prepolymer;
   (b) 5 to 15 weight percent of a polyether diol or triol;
   (c) 20 to 40 weight percent of castor oil;

(d) 5 to 20 weight percent of an epoxy resin containing 2 or more hydroxyl groups;
(e) 0.006 to 0.008 weight percent of a catalyst for the reaction of isocyanate groups with hydroxyl groups.

2. The composition as set forth in claim 1 which further comprises a pigment.

3. The composition as set forth in claim 2 wherein said pigment is present in the amount of about 0.1 to 5 weight percent.

4. The composition as set forth in claim 1 wherein:
(a) said aliphatic diisocyanate prepolymer comprises a 1,6-hexamethylene diisocyanate based adduct and is present in the amount of about 40.9 to 50.0 weight percent of said composition;
(b) said polyether diol or triol comprises polyoxypropylene polyether polyol and is present in the amount of about 10.4 to 12.7 weight percent of said composition;
(c) said castor oil is present in the amount of about 27.8 to 34.0 weight percent of said composition;
(d) said epoxy resin comprises the diglycidyl ether of Bisphenol A and is present in the amount of about 10.4 to 12.7 weight percent of said composition;
(e) said catalyst comprises dibutyl tin dilaurate.

5. The composition as set forth in claim 4 which further comprises 2,4-dinitroaniline coupled to 2-naphthol in the amount of about 0.5 to 0.7 weight percent of said composition.

6. A method for adhesively bonding an electronic component to a printed wiring board comprising:
(a) providing said printed wiring board with said electronic component installed thereon by lead attachments;
(b) providing an adhesive composition comprising:
(1) 30 to 70 weight percent of an aliphatic diisocyanate or triisocyanate prepolymer;
(2) 5 to 15 weight percent of a polyether diol or triol;
(3) 20 to 40 weight percent of castor oil;
(4) 5 to 20 weight percent of an epoxy resin containing 2 or more hydroxyl groups;
(5) 0.006 to 0.008 weight percent of a catalyst for the reaction of isocyanate groups with hydroxyl groups;
(c) applying said adhesive composition to said printed wiring board at a location adjacent to said electronic component;
(d) applying reduced pressure to said printed wiring board with said adhesive composition, whereby said adhesive composition flows under said electronic component and contacts the entire lower surface of said electronic component and the portion of said printed wiring board beneath said component; and
(e) after step (d), heating said printed wiring board to a temperature and for a period of time sufficient to cure said adhesive composition.

7. The method as set forth in claim 6 wherein said adhesive composition further comprises a pigment.

8. The method as set forth in claim 7 wherein said pigment is present in the amount of about 0.1 to 5 weight percent.

9. The method as set forth in claim 6 wherein:
(a) said aliphatic diisocyanate prepolymer comprises a 1,6-hexamethylene diisocyanate based adduct, and is present in the amount of about 40.9 to 50.0 weight percent of said composition;
(b) said polyether diol or triol comprises polyoxypropylene polyether polyol and is present in the amount of about 10.4 to 12.7 weight percent of said composition;
(c) said castor oil is present in the amount of about 27.8 to 34.0 weight percent of said composition;
(d) said epoxy resin comprises the diglycidyl ether of Bisphenol A and is present in the amount of about 10.4 to 12.7 weight percent of said composition;
(e) said catalyst comprises dibutyl tin dilaurate.

10. The method as set forth in claim 9 wherein said adhesive composition further comprises 2,4-dinitroaniline coupled to 2-naphthol in the amount of about 0.5 to 0.7 weight percent of said composition.

11. The method as set forth in claim 10 wherein said reduced pressure is about 0.3 torr or less and is applied for about 30 minutes.

12. The method as set forth in claim 10 wherein said adhesive composition is cured by heating at 160° F. (71° C.) for one hour at ambient pressure.

* * * * *